United States Patent
Hyon et al.

(10) Patent No.: US 8,229,205 B2
(45) Date of Patent: Jul. 24, 2012

(54) PATTERN MATCHING METHOD IN MANUFACTURING SEMICONDUCTOR MEMORY DEVICES

(75) Inventors: Chan-Kyeong Hyon, Gyeonggi-do (KR); Young-Seog Kang, Gyeonggi-do (KR); Sang-Ho Lee, Gyeonggi-do (KR); Hyun-Jong Lee, Busan (KR)

(73) Assignee: Samsung Electronics Co., Ltd. (KR)

( * ) Notice: Subject to any disclaimer, the term of this patent is extended or adjusted under 35 U.S.C. 154(b) by 950 days.

(21) Appl. No.: 12/253,618

(22) Filed: Oct. 17, 2008

(65) Prior Publication Data

US 2009/0103799 A1   Apr. 23, 2009

(30) Foreign Application Priority Data

Oct. 19, 2007  (KR) .................. 10-2007-0105341

(51) Int. Cl.
*G06K 9/00* (2006.01)
*G06K 9/36* (2006.01)
*G06K 9/32* (2006.01)

(52) U.S. Cl. ........ 382/144; 382/141; 382/145; 382/147; 382/151; 382/280; 382/294

(58) Field of Classification Search .................. None
See application file for complete search history.

(56) References Cited

U.S. PATENT DOCUMENTS

| | | | | |
|---|---|---|---|---|
| 5,537,669 A * | 7/1996 | Evans et al. | ................ | 382/141 |
| 5,915,034 A * | 6/1999 | Nakajima et al. | ............. | 382/124 |
| 6,492,066 B1 * | 12/2002 | Capodieci et al. | ................ | 430/5 |
| 7,570,796 B2 * | 8/2009 | Zafar et al. | .................... | 382/144 |
| 7,653,892 B1 * | 1/2010 | Gennari et al. | ................. | 716/50 |
| 7,676,077 B2 * | 3/2010 | Kulkarni et al. | ............. | 382/144 |

\* cited by examiner

*Primary Examiner* — Tom Y Lu
*Assistant Examiner* — Thomas Conway
(74) *Attorney, Agent, or Firm* — Myers Bigel Sibley & Sajovec, P.A.

(57) ABSTRACT

A pattern matching method for use in manufacturing a semiconductor memory device increases a pattern matching rate between a GDS image and an SEM image. The pattern matching method includes extracting a scanning electron microscope (SEM) image and a graphic data system (GDS) image to perform a pattern matching; performing a two-dimensional Fourier transform (FFT) for the extracted GDS image and analyzing a low spatial frequency; deciding whether or not a pattern is a repeated pattern or non-repeated pattern by using the analyzed low spatial frequency; and limiting an X/Y range for a pattern matching when the decision result is for the repeated pattern, and then performing the pattern matching between the SEM image and the GDS image.

6 Claims, 16 Drawing Sheets

PATTERN MATCHING METHOD IN MANUFACTURING SEMICONDUCTOR MEMORY DEVICES

REFERENCE TO PRIORITY APPLICATION

This application claims priority from Korean Patent Application No. 10-2007-0105341, filed Oct. 19, 2007, the disclosure of which is hereby incorporated herein by reference.

FIELD OF THE INVENTION

The present invention relates generally to semiconductor memory devices and, more particularly, to semiconductor memory device manufacturing.

BACKGROUND OF THE INVENTION

In general, semiconductor memory devices are manufactured by depositing thin films for several functions on a wafer surface, patterning it, and forming the geometrical structure of various circuits. Unit processes to manufacture such semiconductor devices may be largely classified as several unit processes, such as: wafer and chamber cleaning processes, etc. to eliminate impurity, including an impurity ion implantation process of implanting impurity ions of group 3B, i.e., B, or group 5B, i.e., P or As, into the interior of semiconductor; a thin film deposition process of forming a material film on a semiconductor substrate; an etching process of forming a given pattern for the material film; an etching process of forming the material layer in a given pattern; and a planarization process (CMP: Chemical Mechanical Polishing) of depositing an interlayer insulation film etc. on the wafer and then collectively polishing the wafer surface to remove a step coverage.

Communication devices and computers are now requiring semiconductor memory devices to have high operational speeds and relatively large storage capabilities. Thus, semiconductor memory devices are increasing in integration level; meanwhile, the design rule becomes reduced. In manufacturing semiconductor memory devices by using such several unit processes, step coverage of the material layer may become defective due to step coverage with adjacent patterns, and the resolution level may decrease in a photolithography process and, thus, it may be difficult to obtain a precise profile. Furthermore, owing to the lack of a process margin, a misalignment may be caused and the reliability of semiconductor memory devices may decrease, thereby negatively affecting yield.

Because of such large capacity and higher integrated tendency in current semiconductor memory devices, the size of respective unit devices constituting memory cells are miniaturized and a process margin is also reduced. This brings about a remarkable development in a high integration technology forming a multilayer structure in a limited area. As an example of the high integration technology for such a multilayer structure, for example, a double layer process of coupling plural metal layers through a metal via contact or a stack transistor process of forming two or more transistors in a vertical structure on the same vertical line of the semiconductor substrate are used generally. For example, in an SRAM, power consumption is less as compared with other memories, but the speed is very fast, thus the SRAM is widely used as cache memories etc. of large capacity and high performance computers, but six transistors constitute one cell structure and thus there is a disadvantage in view of the integration as compared with other memories. Thus the double layer process and the stack transistor structure obtained by vertically stacking at least two layers of transistors, etc. are widely used.

As described above, in employing the double layer process or stack transistor structure etc. to adapt the semiconductor memory devices to the tendency of high integration and in realizing such high integration technology, relatively high precision may be required in unit processes.

For example, in several unit processes applied to the manufacture of semiconductor memory devices, an etching process is one of main processes to form the pattern of material layer for several functions on an upper surface of wafer. In such etching process, among an overall material layer deposited on a semiconductor substrate, only a necessary portion remains and an unnecessary portion is removed. The etching process may be largely classified as wet etching and dry etching. The wet etching is to perform a patterning of material layer by using liquid chemical material, and the dry etching is to pattern a material layer by using gas plasma or ion beam or sputtering without using liquid chemical material. However, as the high integration of semiconductor devices becomes accelerated, a step coverage between respective unit areas constituting a memory cell increases and so an aspect ratio increases, and a line width of circuit patterns becomes more detailed so as to match to such high integration of semiconductor devices, therefore the dry etching is widely used for a more precise pattern.

In such dry etching, particularly in a photo etching process of transferring a pattern of reticle (mask) onto a wafer, there are steps of covering an entire upper part of wafer with photoresist, applying heat and baking to maintain the evenness of the photoresist covering the entire upper part of wafer, partially exposing the photoresist of a portion corresponding to a pattern formed in the reticle (mask) by irradiating light such as ultraviolet rays etc., performing a developing by spraying developing solution to wafer completed in the exposure and thus removing a portion having the irradiation of light or portion not having the irradiation of light in the exposure process through a chemical reaction, and measuring a developed state and aligned state and checking a defect.

In particular, in the checking step it is clarified whether a position alignment between pattern formed through a previous photo etching process and pattern formed through a current photo etching process has been well performed, by using an overlay measurement device. The reason of definitely clarifying such overlay level between the pattern already formed in the previous step and the pattern to be newly formed in the current step is that such overlay level between a lower layer and an upper layer becomes an important factor of deciding a yield and reliability of semiconductor memory devices according to the high integration and miniaturization of semiconductor memory devices. Such overlay between lower layer and upper layer is generally measured through an overlay mark constructed of a main scale and a subscale, and such overlay mark is mainly formed in a scribe area so as not to influence a memory cell area.

Further, in the checking step, together with the overlay confirming operation described above it is checked and confirmed whether a width of pattern transcribed in the wafer was formed as a desired size, by using a critical dimension scanning electronic beam microscope (CDSEM). However, the number of CD (Critical Dimension) measurement points to be tested per step of process is getting increased by an increased integration in a semiconductor chip manufacturing process, thus an Auto CDSEM system is actively used.

Further, there has been recently introduced a metrology automation system for performing a global matching between a graphic data system (GDS) image and a CD (Critical Dimension) scanning electron microscope (SEM) image of measurement position by interlocking a CDSEM and GDS image as a storage format of layout, thereby measuring a number of measurement points through one recipe write. However a matching rate between patterns reaches only 90% due to an incompletion of matching algorithm between a GDS image and an image from the CDSEM, thus a point that matching fail has occurred is compensated through a correction of recipe.

FIGS. 1A and 1B illustrate a GDS image in an FOV (Field Of View) having an error of pattern matching according to conventional art.

FIGS. 1A and 1B illustrate a GDS image for a pattern 12 formed on a lower material layer 10. A position 14 of a target is designated on a center portion of the GDS image. In FIGS. 1A and 1B, a pattern matching error position is shown and it is found that the pattern matching error has occurred in an X direction in the event of pattern matching. In this case, when moving an integer multiple of repeated pitch, it is decided as the same image and then an image is shifted right and left to compare. During such comparison operation, a pattern matching is stopped at a position that is decided as any more similar position. That is, positions of satisfying the condition of pattern matching may become several.

FIGS. 2A and 2B illustrate a GDS image of a FOV with a successful pattern matching.

FIGS. 2A and 2B illustrate a GDS image for pattern 22 formed on lower material layer 20. A position 24 of target is indicated in a center portion of the GDS image. In FIGS. 2A and 2B, an exact pattern matching state is shown without indicating the pattern matching error position 16. This is a unique image without a pattern repetition in right and left and upward and downward, and a position satisfying a pattern matching condition is one.

An analysis for a corresponding image to get a satisfied pattern matching method can provide the following result.

a) A pattern matching error occurrence image has a repeated pattern of a specific direction and a specific pitch.

b) A shifted level in a pattern matching error occurrence is an integer multiple of pitch.

c) An image succeeded in a pattern matching is not repeated in the pattern.

As shown in FIGS. 1A and 1B, causes why a GDS image 14 within FOV does not accord with a CDSEM image for an actual pattern may be as the following description.

Image for pattern existing in the FOV area is obtained by measuring a measurement point through CDSEM, and then a pattern matching with the GDS image is performed. When in the pattern matching with the GDS image, an image is repeated in Y and X directions and the measurement is performed for a movement of distance corresponding to an integer multiple of repeated pitch, the pattern matching is performed at a faulty position.

Like that, for example, when a global matching between GDS image and CDSEM image is not normally performed, a measurement fail occurs and so a CD value of undesired position is measured, thus the reliability of a measurement value falls, causing a failure in a process monitoring step using such a measurement value.

Further, when the global matching between the GDS image and the CDSEM image is not normally performed, there is an inconvenience to have to review a number of measurement points and to have to re-measure relating to a matching fail point, thus causing time consumption and a decrease in a driving rate of metrology system.

However, when a global matching between a GDS design in a FOV and a CDSEM image for an actual pattern is not precise, an alignment of patterns formed in a subsequent process is getting worse, thus largely decreasing reliability and productivity of semiconductor memory devices.

SUMMARY OF THE INVENTION

Accordingly, some embodiments of the invention provide a pattern matching method for use in manufacturing semiconductor memory devices, capable of substantially increasing the success ratio of pattern matching between a GDS image and a CDSEM image. Time required for pattern matching between a GDS image and a CDSEM image can be substantially reduced, thereby increasing a driving rate of a metrology system. In addition, an image shift limitation condition for pattern matching is automatically calculated by analyzing a spatial frequency component of a target pattern, thereby increasing a success rate of position matching of a pattern.

According to an embodiment of the invention, a pattern matching method for use in manufacturing a semiconductor memory device comprises extracting an SEM image and a GDS image to perform pattern matching; performing a two-dimensional Fourier transform (FFT) for the extracted GDS image and analyzing a low spatial frequency; and comparing the analyzed low spatial frequency with a predetermined threshold value, and limiting an X/Y range for a pattern matching when the analyzed low spatial frequency is compared to a predetermined threshold value and is smaller than the threshold value, and then performing the pattern matching between the extracted SEM image with the GDS image.

According to another embodiment of the invention, a pattern matching method for use in manufacturing a semiconductor memory device comprises extracting an SEM image and a GDS image to perform pattern matching; performing a two-dimensional FFT for the extracted GDS image and analyzing a low spatial frequency; deciding whether it is a repeated pattern or non-repeated pattern by using the analyzed low spatial frequency; and limiting an X/Y range for pattern matching when the decision result is for the repeated pattern and thus performing the pattern matching between the SEM image and the GDS image.

When the decision result is not for the repeated pattern, the method may further comprise performing pattern matching between the GDS image and the SEM image through the existing method.

The performing of the pattern matching comprises calculating a pattern matching range and a movement mean value obtained by deducting a pattern matching position value from a movement position in the event of pattern matching, and performing a pattern matching of the SEM image with the GDS image by limiting an X, Y range of the calculated pattern matching.

The method may beneficially further comprise re-performing a pattern matching of the SEM image with the GDS image by increasing 20% the X, Y range for the pattern matching when the pattern matching was not successful in the performing of the pattern matching.

As described above, in the pattern matching between the GDS image and the SEM image, an SEM image and GDS image corresponding to a specific FOV area are separately extracted, and then it is decided whether the GDS image is a repeated pattern image or non-repeated pattern image. When the GDS image is the repeated pattern image, the range of X and Y directions is limited in performing the pattern matching, thereby dominantly improving a pattern matching rate and substantially reducing a matching fail.

That is, the pattern matching rate in a global matching can be improved and thus a precise CD measurement value can be obtained, thereby enhancing the reliability and productivity of semiconductor memory devices.

Further, a large number of measurement points do not have to be reviewed through an improved pattern recognition and matching rate and so a re-measurement is unnecessary, thereby reducing time taken for pattern matching and increasing a driving rate of a metrology system.

BRIEF DESCRIPTION OF THE DRAWINGS

The present invention will become more fully understood from the detailed description given hereinbelow and the accompanying drawings, which are given by way of illustration only, and thus are not limitative of the present invention.

DETAILED DESCRIPTION OF PREFERRED EMBODIMENTS OF THE INVENTION

Embodiments of the present invention now will be described more fully hereinafter with reference to FIGS. 3 to 7, in which embodiments of the invention are shown. This invention may, however, be embodied in many different forms and should not be construed as limited to the embodiments set forth herein. Rather these embodiments are provided so that this disclosure will be thorough and complete, and will fully convey the scope of the invention to those skilled in the art.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

The number of CD measurement points to be tested per process step tends to become exponentially increased by an integration increase in a semiconductor chip manufacturing process. In the art, therefore a smooth CD measurement for plural measurement points is performed by using an auto CD-SEM system. Further, there has been recently introduced a metrology automation system for performing a pattern matching through the matching between GDS (Graphic Data System) image and CD-SEM image of measurement position by interlocking an auto CD-SEM and GDS as a storage format of layout, thus efficiently measuring many measurement points through one recipe write.

Conventionally, however, a matching rate between patterns reaches only a level of 90% due to an incompletion of matching algorithm between a GDS image and an SEM image obtained in the CD-SEM, thus an occurrence point of matching fail is compensated through a correction of recipe. In an analysis result of a pattern image for an occurrence area of pattern matching fail to find an occurrence cause of such matching fail, it is found that when for repeated pattern like in DRAM or flash memory, the measurement is performed for a movement corresponding to an integer multiple of pitch, it is regarded as the same pattern and thus the matching is not attempted any more and the matching work is finished. In this case, the CD value is measured on other position not a position to have to be measured, thus dropping a reliability of corresponding data.

Therefore, in some embodiments of the present invention, a repeated pattern is provided with an image that a low-frequency component level of spatial frequency spectrum is below a threshold value through a spatial frequency component analysis of target pattern, and thus a limitation condition of image shift for a pattern matching is automatically calculated to increase a matching rate. The position matching operation of pattern is described in detail as follows, referring to FIGS. 3 to 7.

Figure 1A:
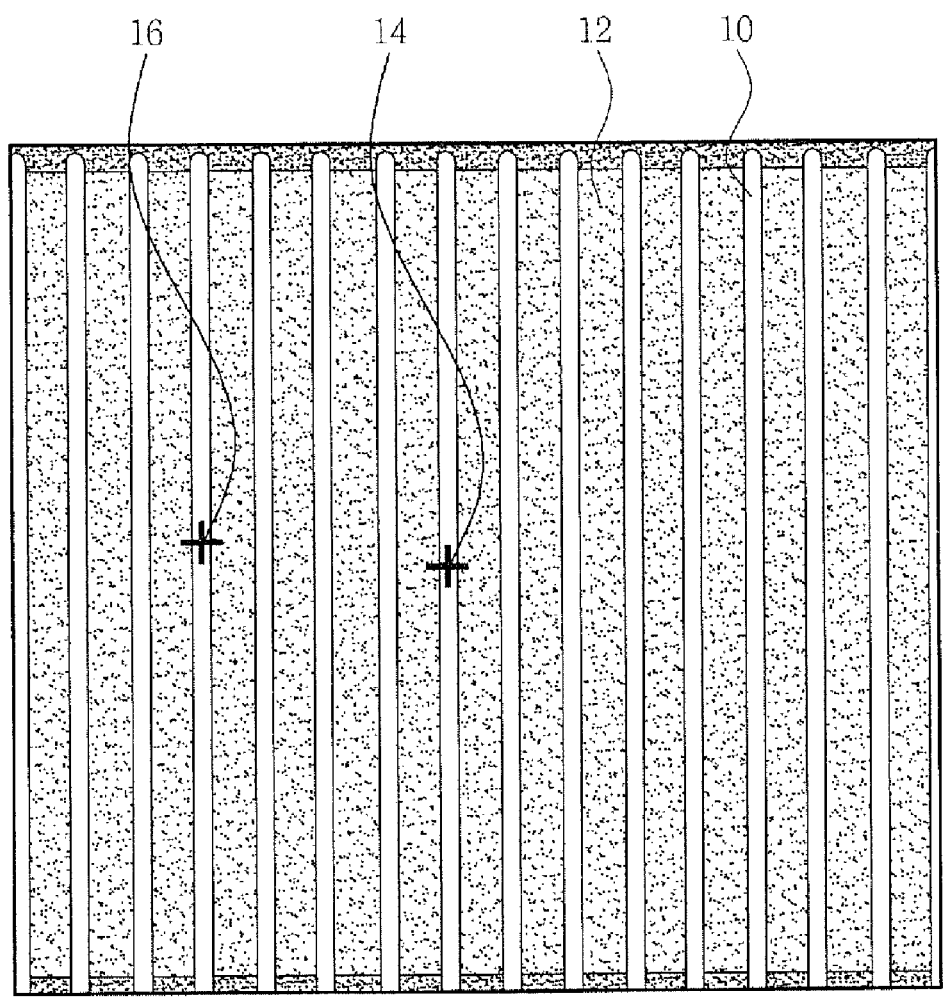
FIGS. 1A and 1B illustrate a prior art GDS image in an FOV having an error of pattern matching.
Figure 1B:
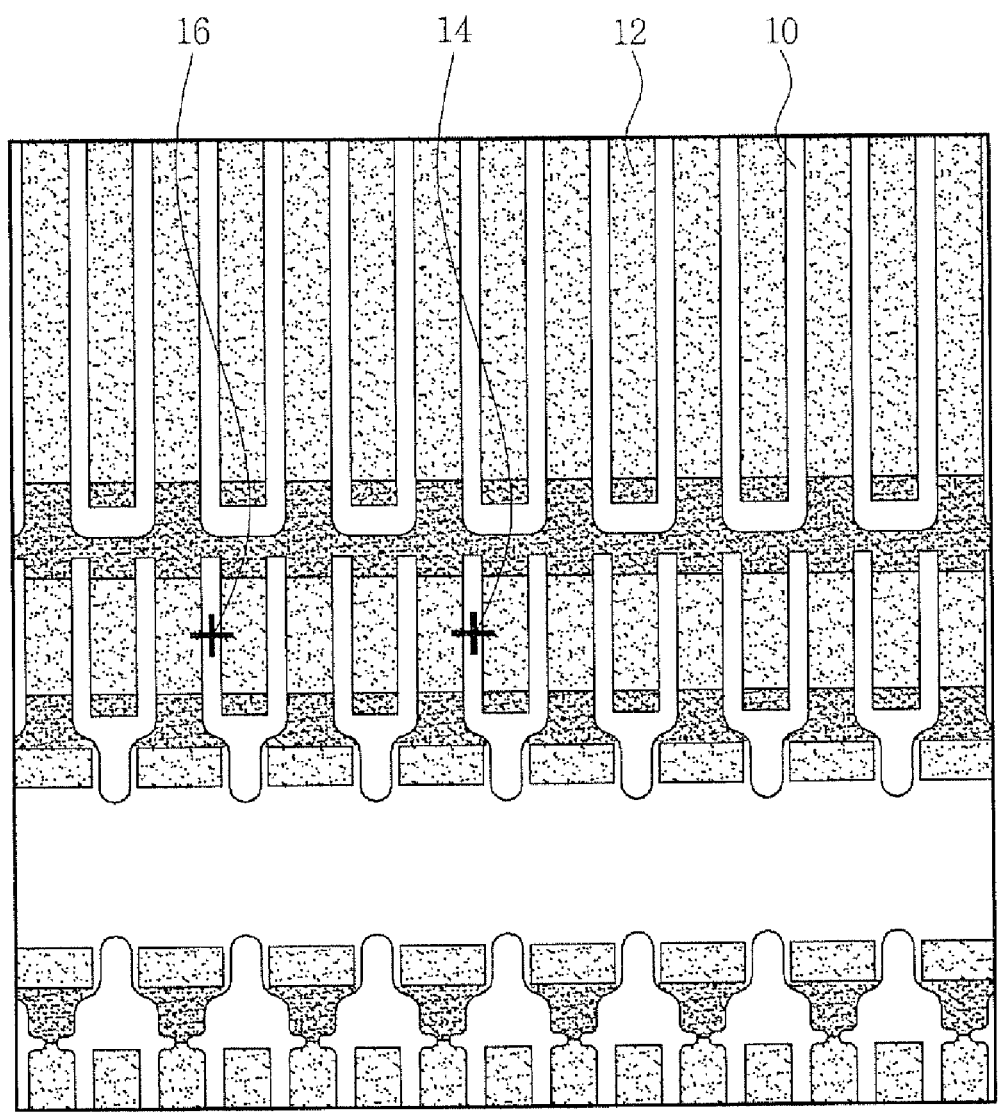
Figure 2A:
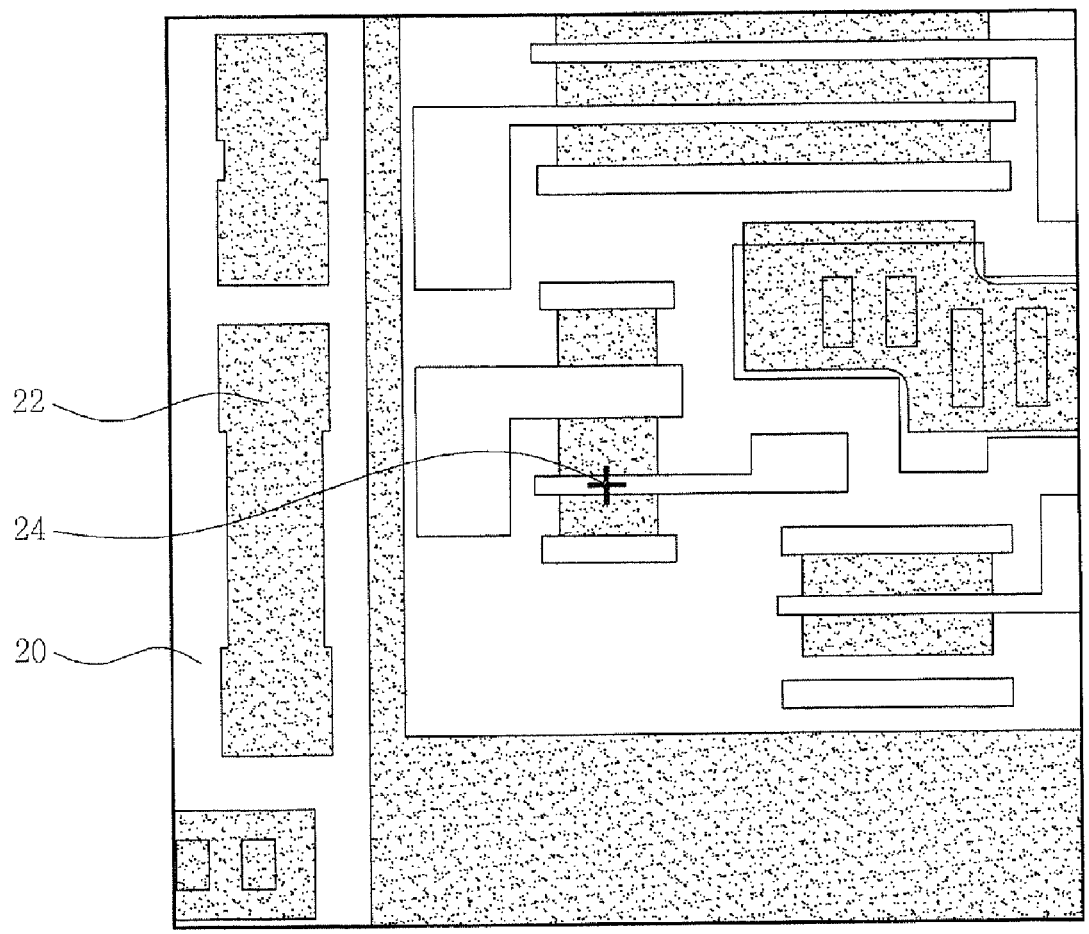
FIGS. 2A and 2B illustrate a prior art GDS image of a FOV with a successful pattern matching.
Figure 2B:
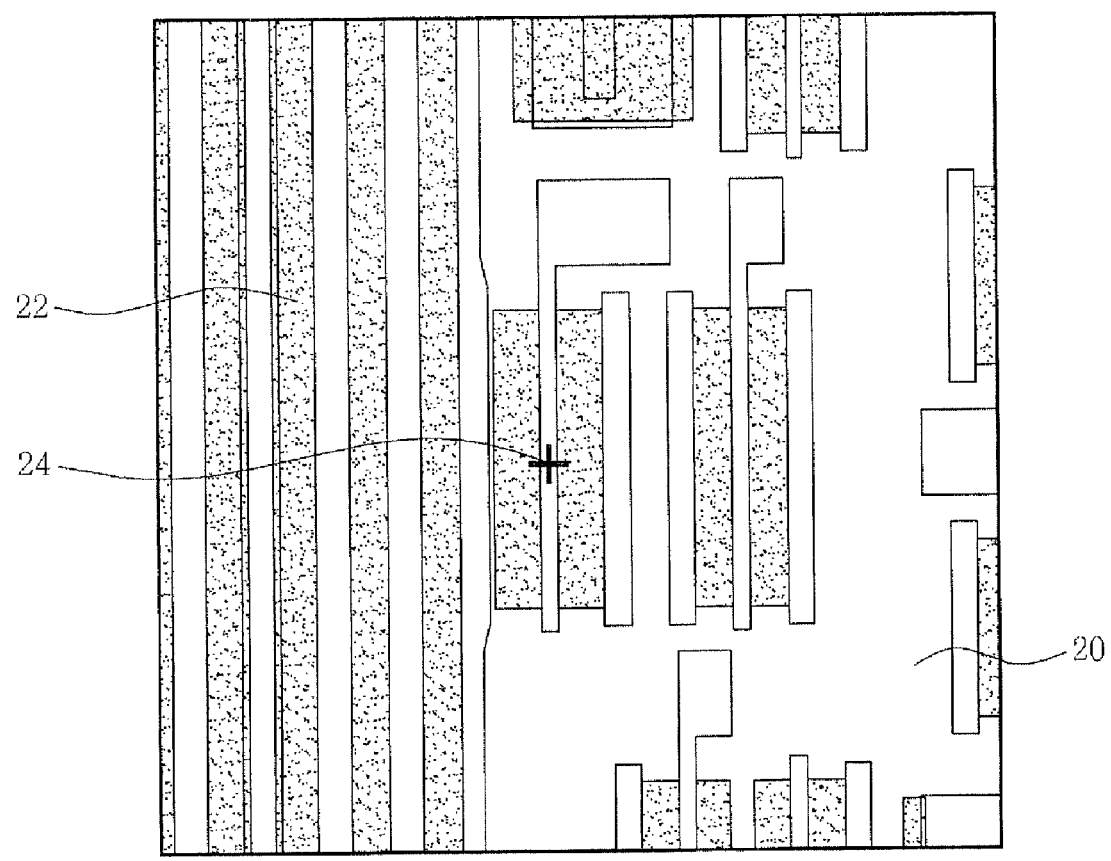
Figure 3:
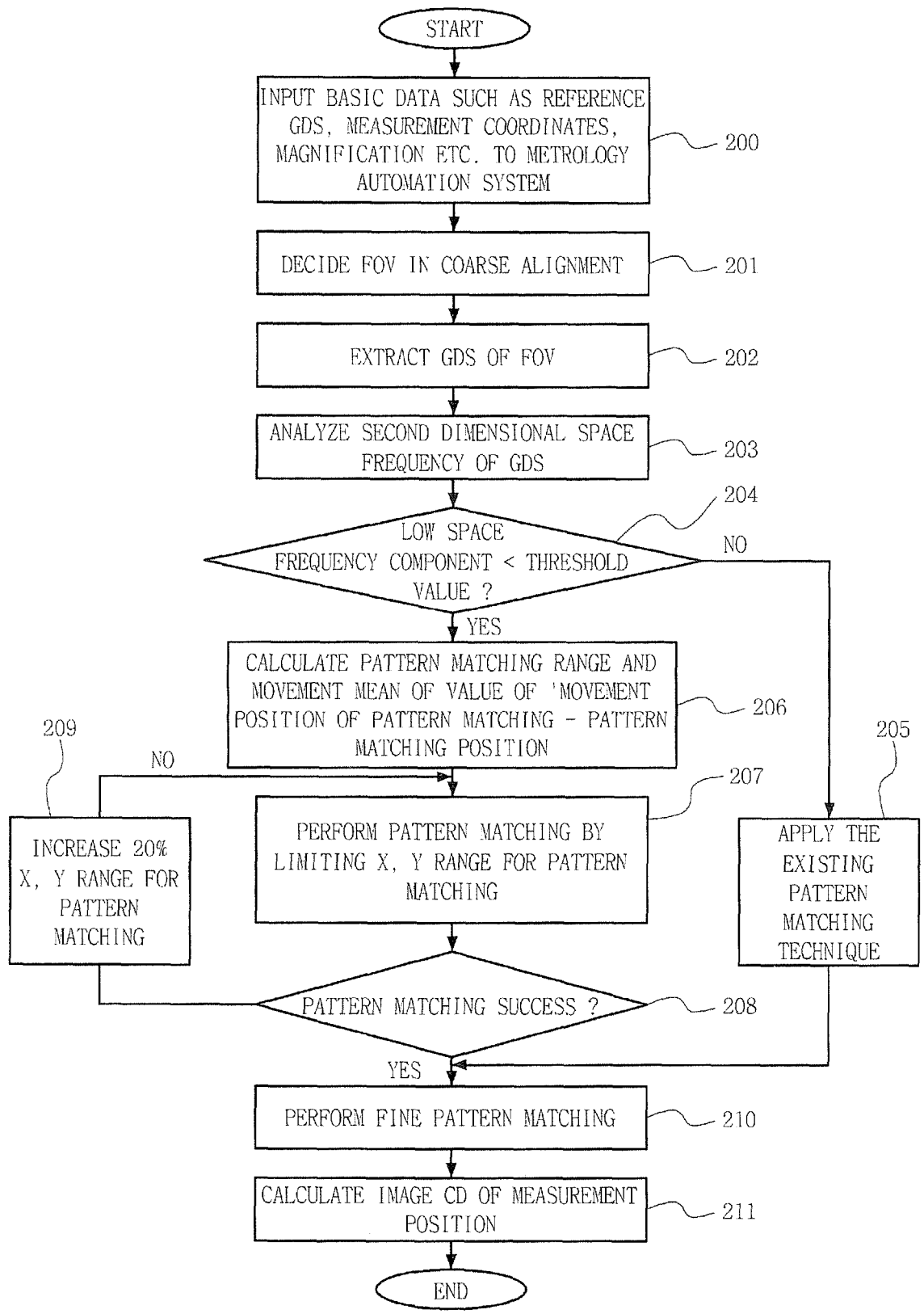
FIG. 3 is a flow chart totally illustrating pattern position matching steps according to an embodiment of the invention.

FIG. 3 is a flow chart totally illustrating pattern position matching steps according to an embodiment of the present invention.

Referring to FIG. 3, in step 200, basic data such as a reference GDS, measurement coordinates, magnification etc. are input to a metrology automation system.

In step 201, an FOV (Field of View) for an area requiring a pattern matching in an overall wafer is decided in the event of coarse alignment.

Figure 4A:
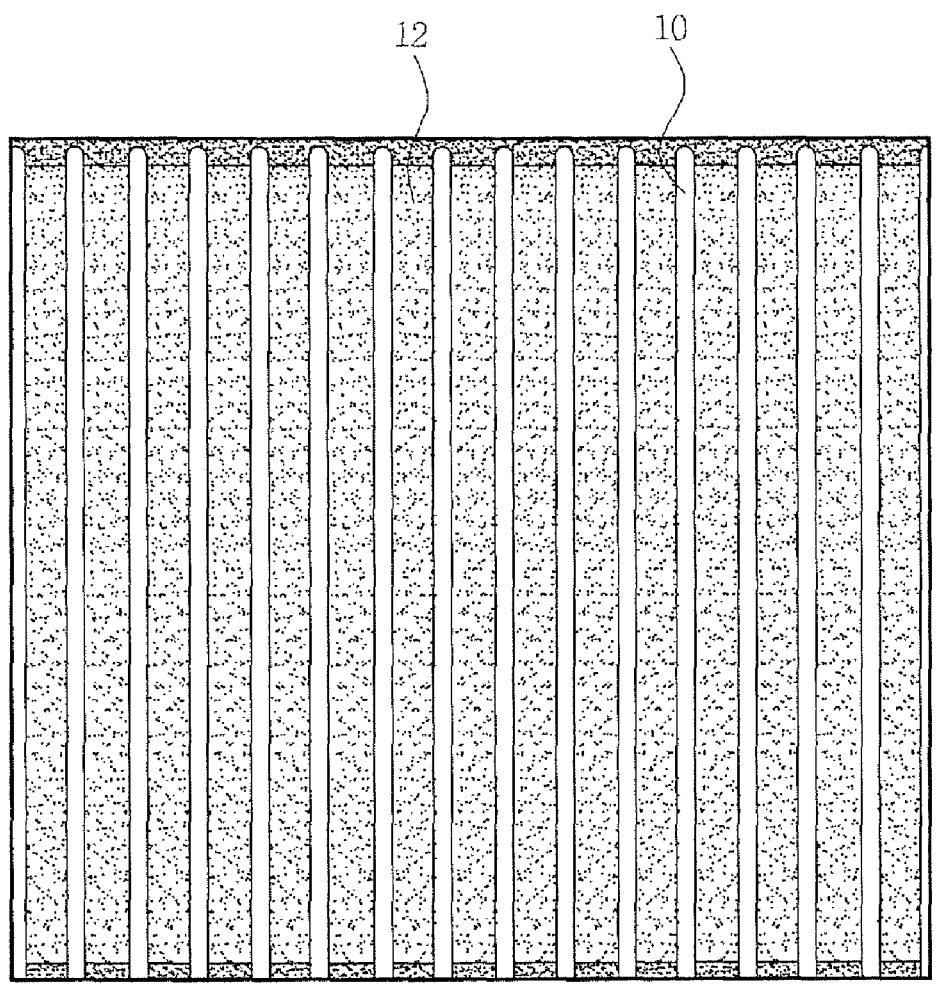
FIG. 4A illustrates a GDS image for a repeated pattern formed on a material layer.

In step 202, GDS image and SED image for X and Y directions of FOV decided in step 201 are extracted. FIG. 4A illustrates a GDS image for a repeated pattern 12 formed on a material layer 10.

Figure 4B:
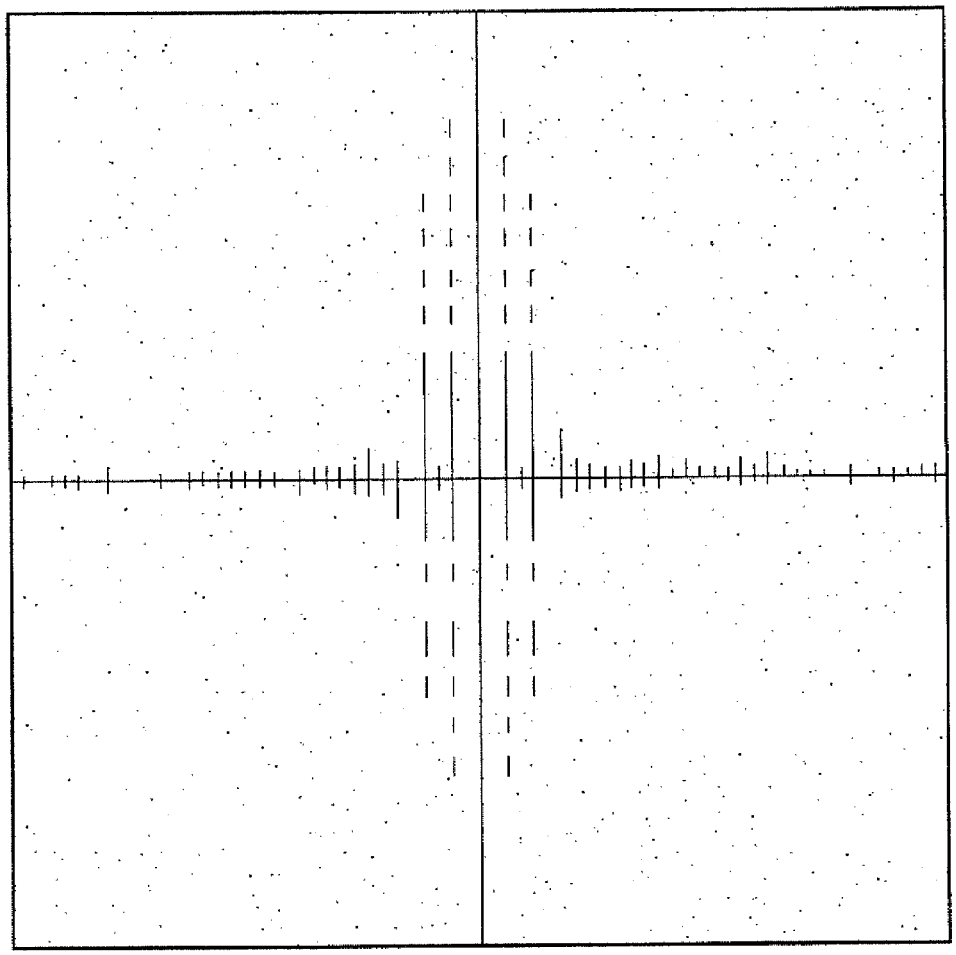
FIG. 4B illustrates in a local scale a spectral density of GDS image for FOV shown in FIG. 4A.

Subsequently, in step 203, a two-dimensional Fourier-transform for the GDS image is performed and the spectrum of repeated pattern can be calculated in a spatial frequency area and the size thereof is analyzed. In FIG. 4B, a spectral density of GDS image for FOV shown in FIG. 4A is represented in a local scale.

Figure 4C:
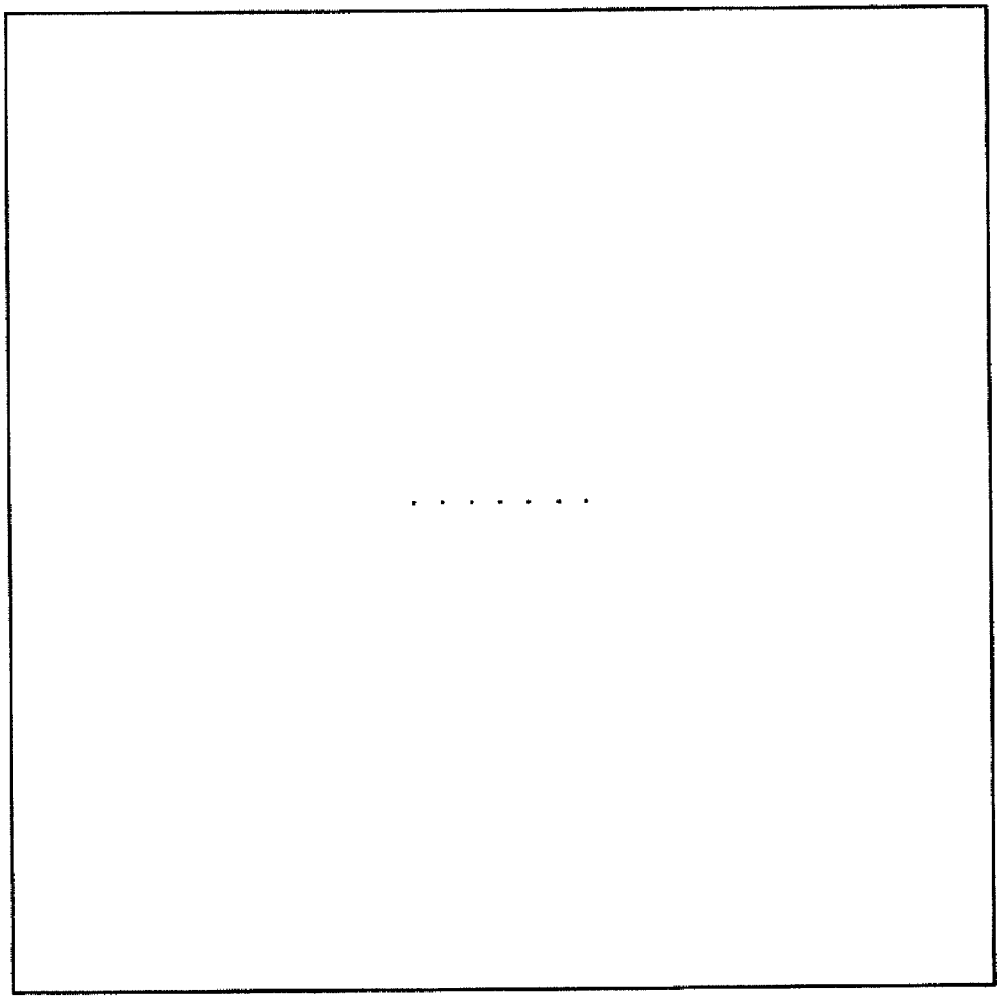
FIGS. 4C and 4D are pictures showing spectral density with threshold value to obtain a more precise frequency component for GDS image of FOV.
Figure 4D:
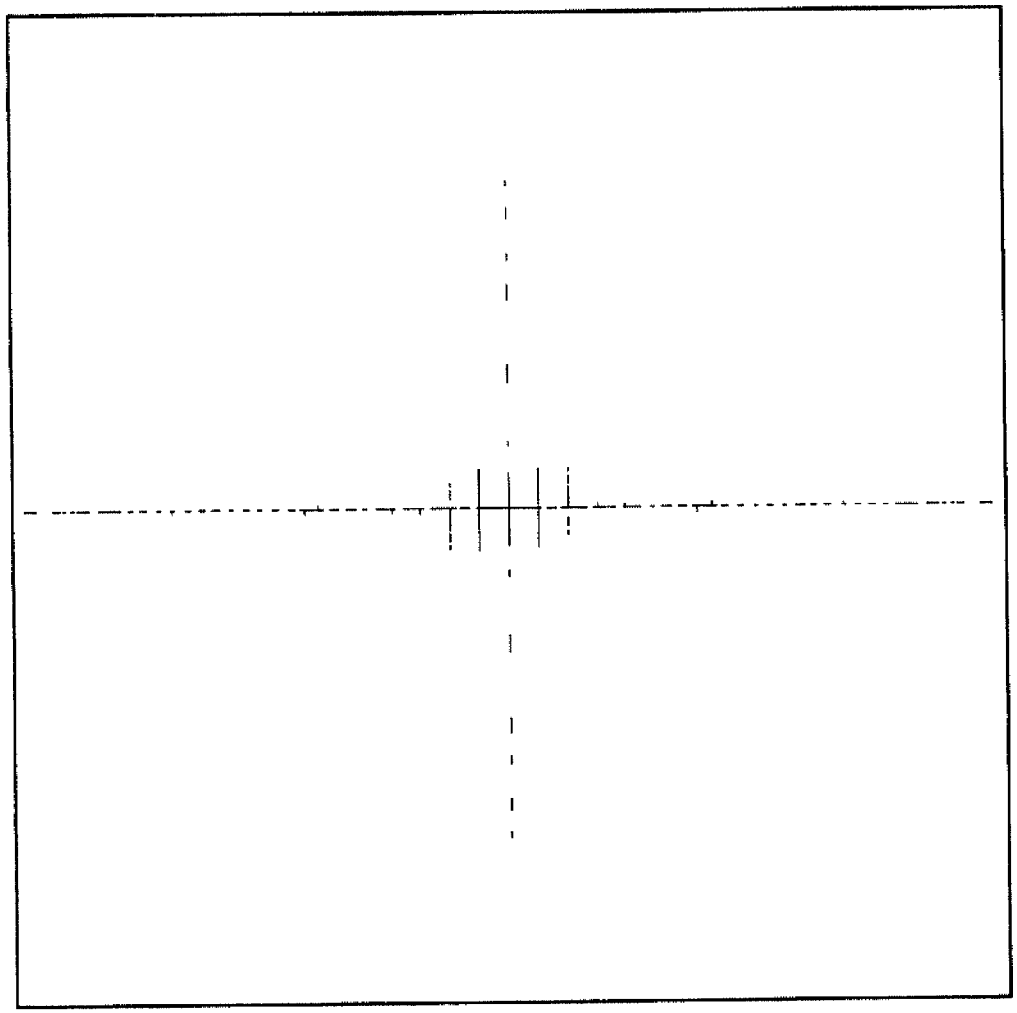

FIGS. 4C and 4D are pictures showing spectral density with threshold value to obtain a more precise frequency component for GDS image of FOV. FIG. 4C provides a picture with a first threshold value, and FIG. 4D is a picture with a second threshold value smaller than the first threshold value.

Referring to FIGS. 5A to 5D, FIG. 5A illustrates a GDS image for a non-repeated pattern 22 formed on a material layer 20.

Figure 5A:
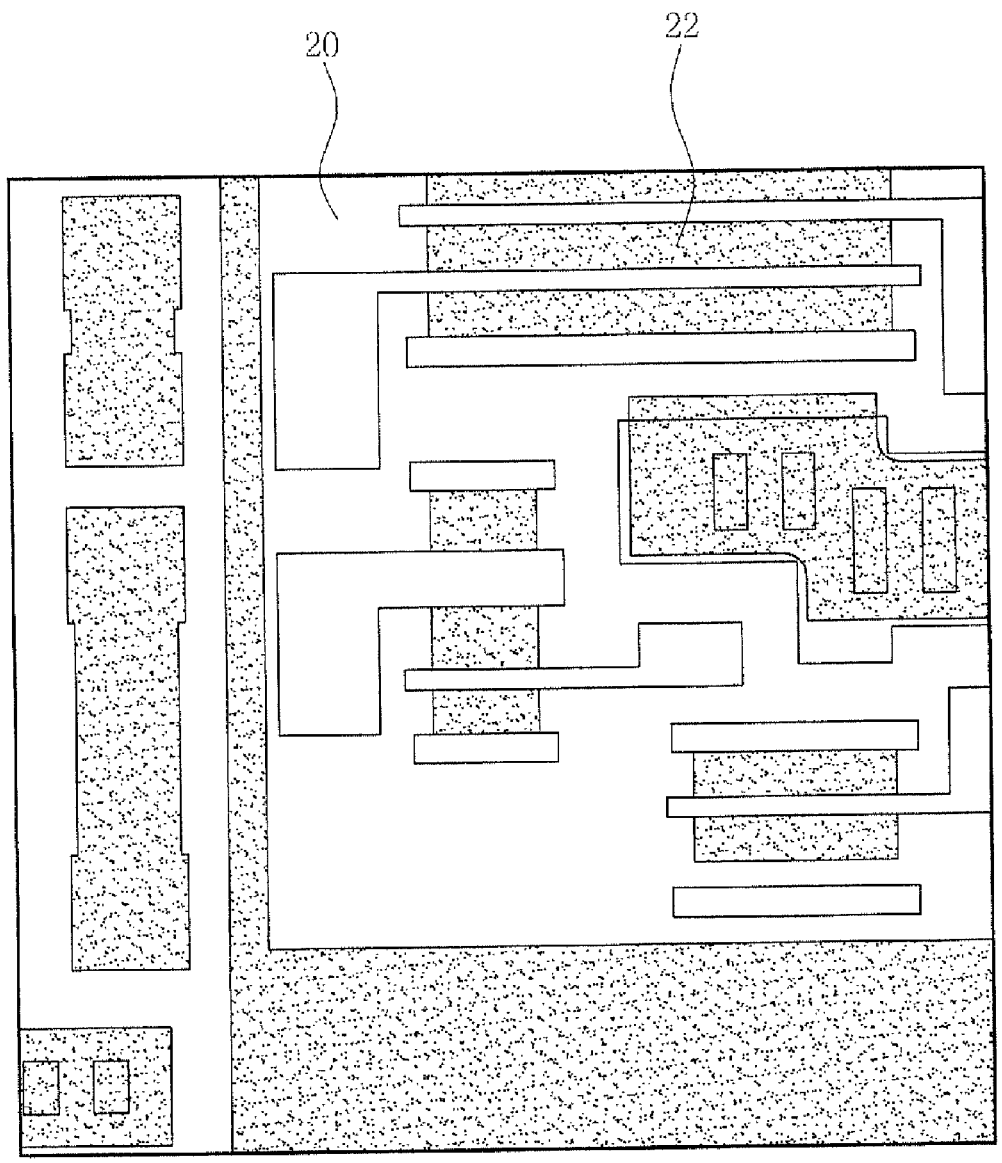
FIG. 5A illustrates a GDS image for a non-repeated pattern 22 formed on a material layer 20.
Figure 5B:
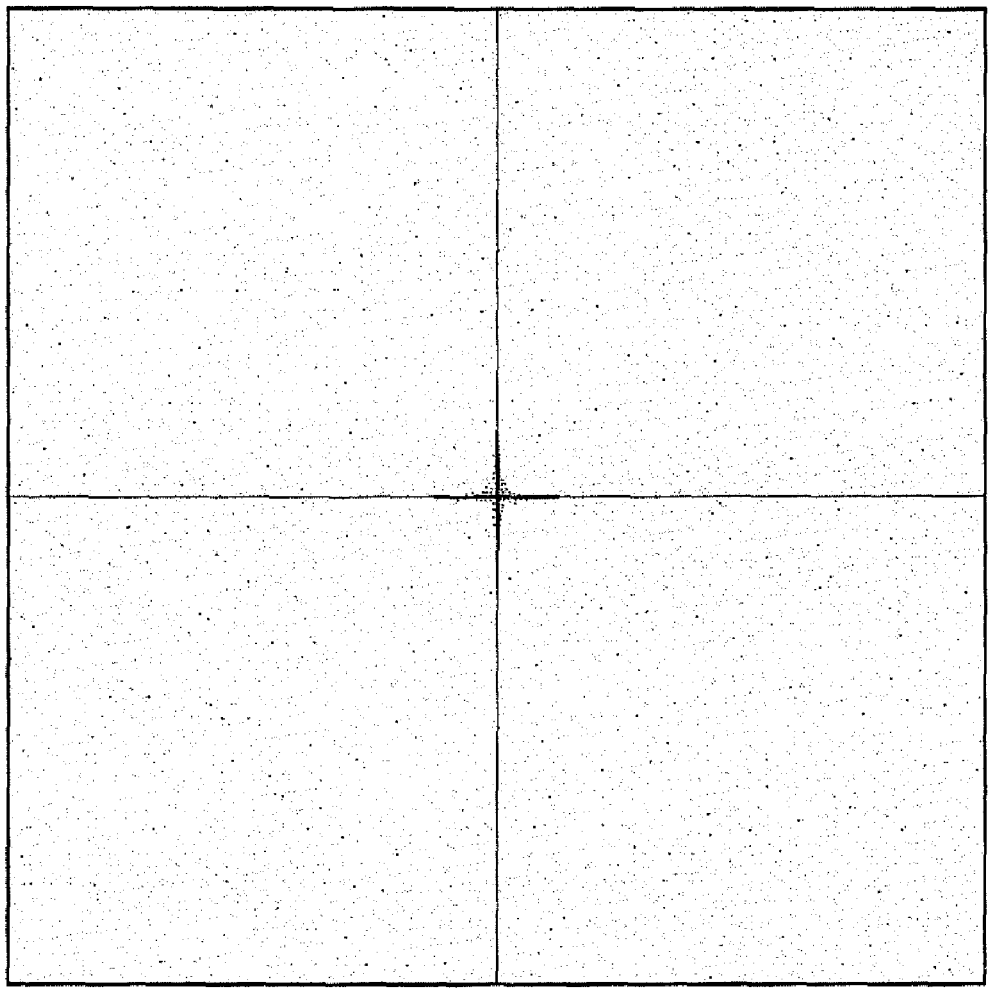
FIG. 5B represents in a local scale a spectral density of GDS image for FOV shown in FIG. 5A.

FIG. 5B represents in a local scale a spectral density of GDS image for FOV shown in FIG. 5A.

Figure 5C:
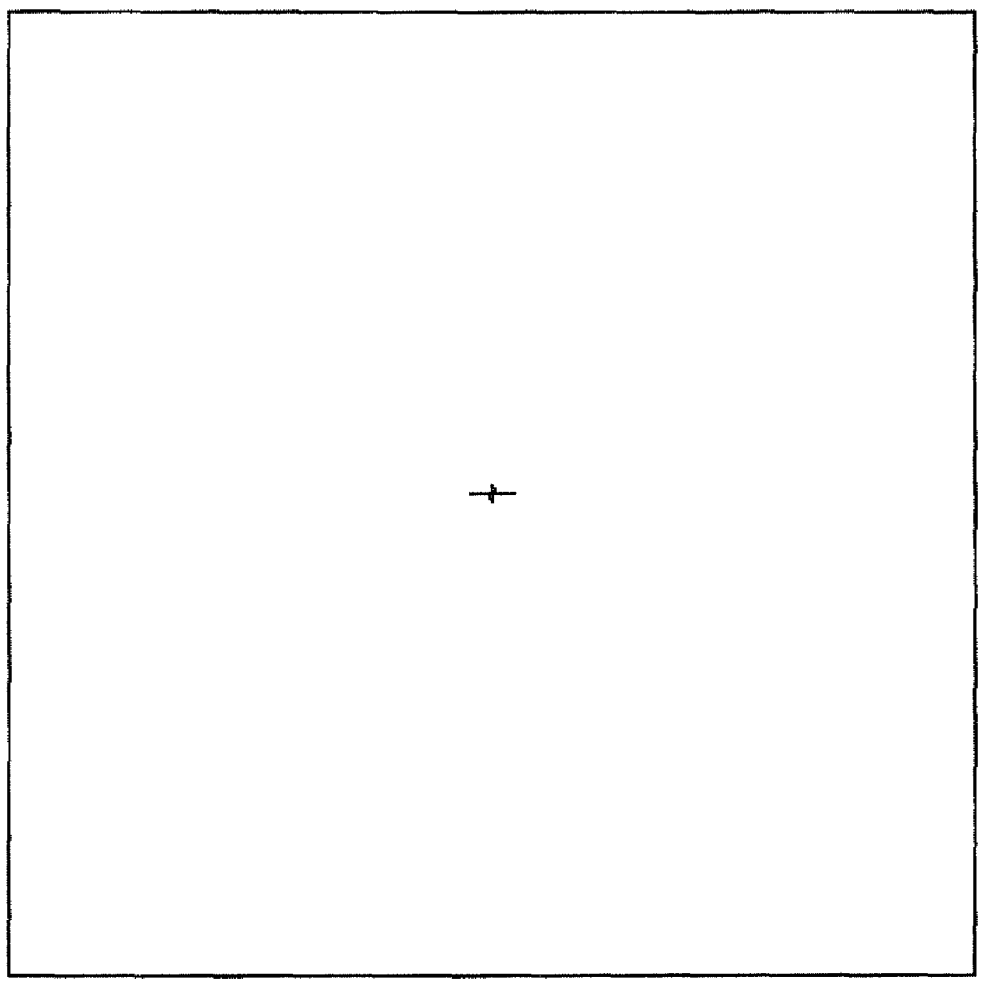
FIGS. 5C and 5D are pictures showing spectral density with threshold value to obtain a more precise frequency component for GDS image of FOV.
Figure 5D:
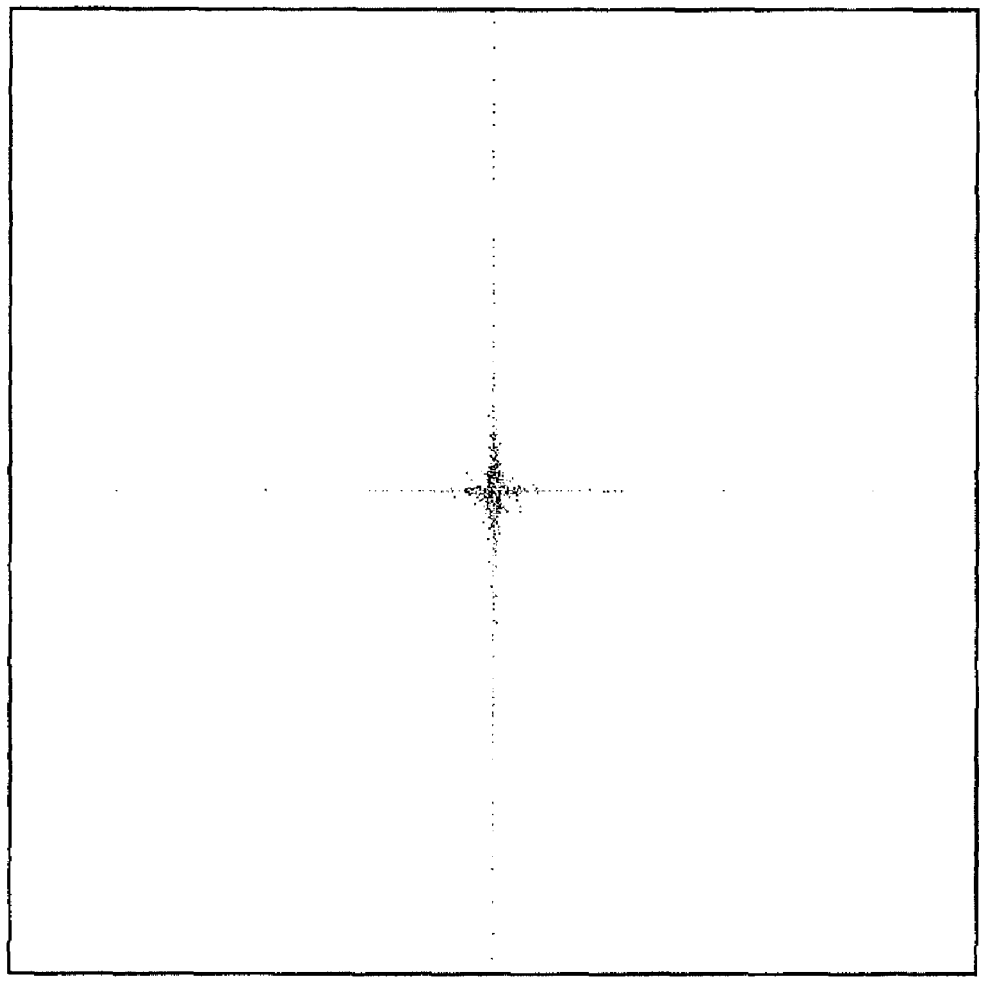

FIGS. 5C and 5D are pictures showing spectral density with threshold value to obtain a more precise frequency component for GDS image of FOV. FIG. 5C provides a picture with a first threshold value, and FIG. 5D is a picture with a second threshold value smaller than the first threshold value.

In analyzing FIGS. 4D and 5C of the pictures representing a spectral density as a threshold image shape in the spatial frequency analysis result, it can be decided whether a corresponding pattern is repeated or not. A center portion in the pictures of FIGS. 4D and 5C indicates a DC component as a point of spatial frequency 0, and the more approach it goes right and left, and upward and downward therein, the more the frequency increases. That is, when frequency becomes relatively higher, it becomes farther from the center in the pictures, and when frequency becomes relatively lower, it becomes nearer the center.

Besides FIGS. 4D and 5C, in a result of analyzing various repeated patterns and non-repeated patterns, a spectral density of repeated pattern like in FIG. 4D is represented as a pattern of dots or line type at a specific position. In particular, the repeated pattern is repeated in a specific cycle in an X direction and the spectral density is represented as dots on an X axis. The non-repeated pattern is represented in a pattern of type the spectral density is concentrated on the center portion as shown in FIG. 5D, thus it can be found that most are a low frequency component.

In step 204 after analyzing the two-dimensional spatial frequency of GDS described above, a low frequency component below a specific frequency is analyzed and it is checked whether the low frequency component is less than a predetermined threshold value.

When in the checking result of step 204, the low frequency component below the specific frequency is greater than a predetermined threshold value, in step 205 a movement measurement corresponding to an integer multiple of pitch as the existing pattern matching technique is performed in the pattern matching. Here, a range of the threshold value is a reference value range to decide whether the existing pattern technique is applied or an improved pattern matching technique of the invention is applied for a result value of low frequency component.

Figure 6A:
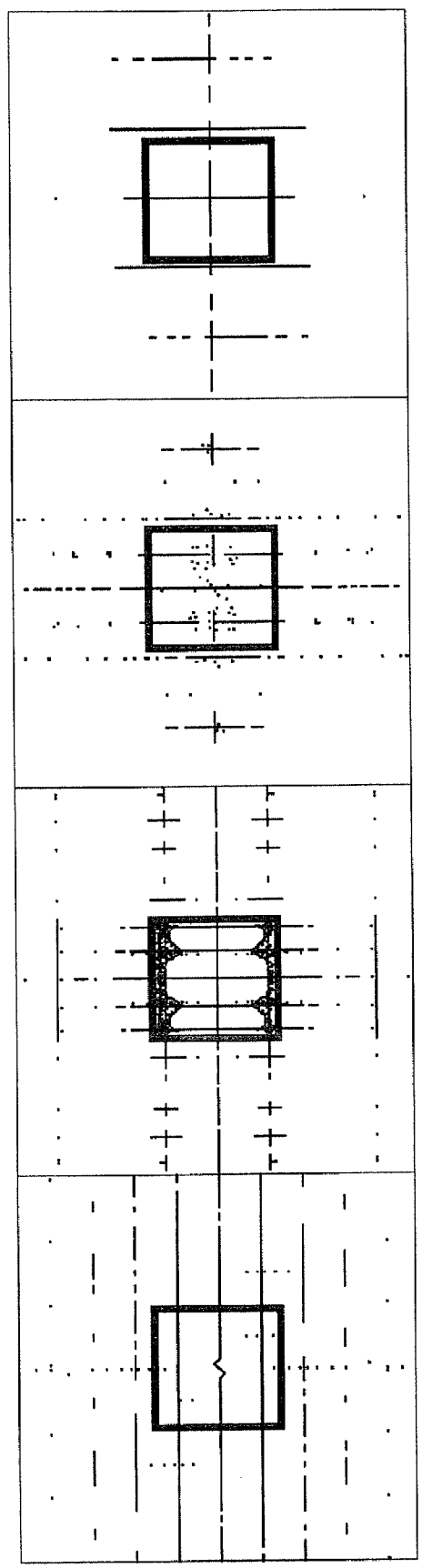
FIGS. 6A and 6B illustrate in an image, a threshold value of low frequency component below a specific frequency.
Figure 6B:
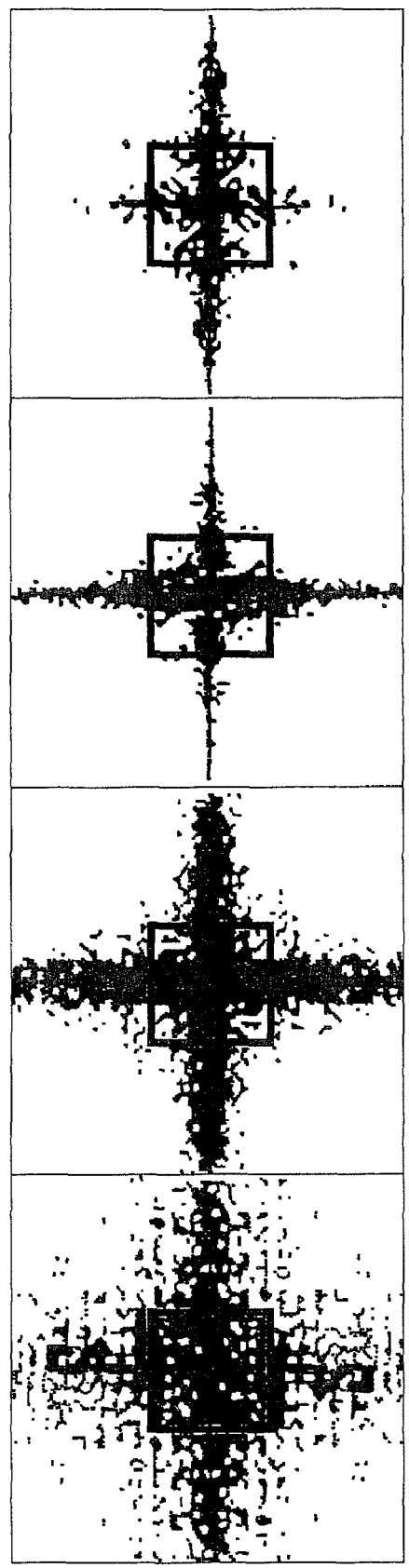

FIGS. 6A and 6B provide as an image a threshold value of low frequency component below a specific frequency, and a center portion of the image indicates a point of spatial frequency "0" as already described above. FIG. 6A represents a specific frequency component corresponding to a repeated pattern in an X, Y or optional direction through a characteristic of repeated pattern. In FIG. 6A, a white portion in a center portion of a box is 30~40% or below of an entire area of the box. However, in FIG. 6B, most spectrums are concentrated on the periphery of a far point according to a characteristic of non-repeated pattern, that is, most are low frequency components. It can be thus found that a white portion of a corresponding area is 70% or more of the box size. A reference of repetitiveness can become numerical in a box size of spectrum density reference image and a frequency component distribution rate of the box.

At step 204, when a low frequency component is greater than a threshold value of predetermined low frequency component, the existing pattern matching technique is applied in step 205.

However, when the low frequency component is less than a threshold value of predetermined low frequency component, operations proceed to step 206 to calculate a pattern matching range and movement mean of value that is obtained by deducting a pattern matching position from a movement position in the event of pattern matching.

At step 207, the pattern matching is performed by limiting an X, Y range for the pattern matching. The pattern matching is performed and it is checked in step 208 whether the pattern matching was successful, and when the pattern matching was unsuccessful, operations proceed to step 209. In step 209, the X, Y range for the pattern matching increases 20% and then operations return to step 207 to again perform the pattern matching.

As described above, some embodiments of the present invention use a statistical analysis result of shifted level for a pattern matching after a movement to a corresponding position for a measurement in the existing SEM. The existing matching method has a very large movement range of pattern within the measurement FOV. In a result of analyzing patterns having a pattern matching error in the event of measurement of FOV 80%, a shifted level for a pattern matching of repeated pattern in the system is about 1~2 micrometer as compared with a mean shift value, but in the non-repeated pattern, a shifted level is decided by a stage driving accuracy of the system, and a standard deviation is within 300~400 nm from a mean shift value. Therefore the pattern can be matched at an exact position when a shifted level for the matching of repeated pattern is limited to a ±standard deviation of central value.

Like that, when the pattern matching was successful, step 210 for a fine pattern matching is performed. In step 211, a CD (Critical Dimension) of SEM (Scanning Electron Microscope) measurement image is calculated.

Figure 7:
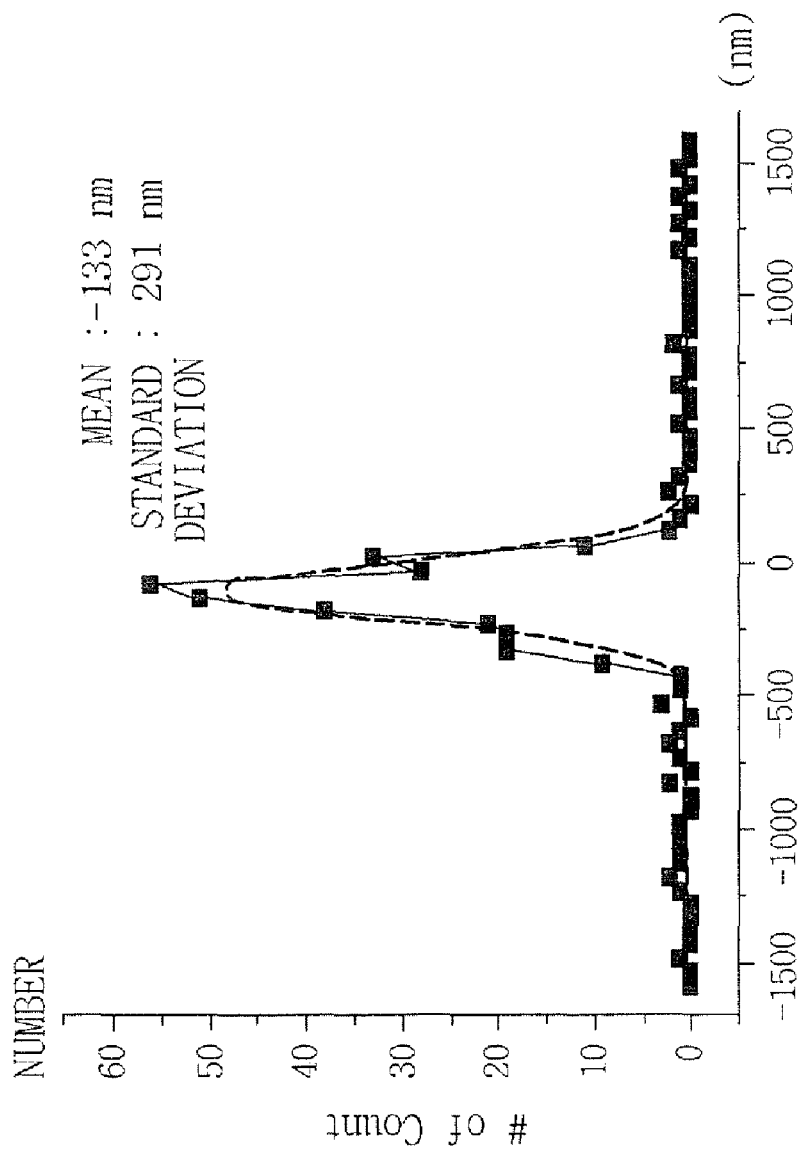
FIG. 7 is a histogram representing a shifted level of Y direction for a pattern matching according to an embodiment of the invention.

FIG. 7 is a histogram illustrating a shift level of Y direction for a pattern matching according to an embodiment of the present invention.

As shown in FIG. 7, a mean shift level of Y direction for the pattern matching is −133 nm, and within a standard deviation±291 from this value, most pattern matching is performed.

In actually operating the system, a shift value in the pattern matching is a level changed according to a change of a die of a wafer where pattern to be measured is positioned. Thus, the shift value is subordinate to a die and a calculation result for a shifted range must be re-calculated every change of a die where a pattern is positioned.

In a coarse alignment, a limited shift value applied for repeated pattern is calculated as follows.

In measuring a corresponding die, a shift level for a matching of patterns not repeated is a value applied to the existing pattern matching, and at this time, movement mean value and standard deviation of components of X, Y direction in the shift level are a mean and standard deviation of shift level for a matching of repeated pattern. The mean and standard deviation value of the shift level are continuously updated every measurement.

When in the result, a low frequency component level of spatial frequency spectrum is a reference value or below through an analysis of low frequency component between GDS image and SEM image for a determined FOV area, it is regarded as a repeated pattern and thus a pattern matching can be performed successfully by calculating a limitation condition of image shift for a pattern matching, thereby obtaining a CD value of precise position in the CD measurement. A CD value can be measured at a precise position, thus enhancing reliability for an obtained CD measurement value and increasing a success rate in a photo etching process by actively applying the invention to a process monitoring.

As described above, according to some embodiments of the invention, it does not have to review a number of measurement points through an improved pattern recognition and matching rate, and time taken in a pattern matching can be reduced through an unnecessary re-measurement, thereby increasing a driving rate of metrology system.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A pattern matching method for use in manufacturing a semiconductor memory device, the method comprising:
    extracting a scanning electron microscope (SEM) image and a graphic data system (GDS) image to perform pattern matching;
    performing a two-dimensional Fourier transform (FFT) for the extracted GDS image and analyzing a low spatial frequency; and
    limiting an X/Y range for pattern matching when the analyzed low spatial frequency is compared to a predetermined threshold value and is smaller than the threshold value, and then performing the pattern matching between the extracted SEM image and the GDS image.

2. The method of claim 1, wherein performing the pattern matching comprises:
    calculating a pattern matching range and a movement mean value obtained by deducting a pattern matching position value from a movement position in the event of pattern matching; and
    performing a pattern matching of the SEM image with the GDS image by limiting an X, Y range of the calculated pattern matching.

3. A pattern matching method for use in manufacturing a semiconductor memory device, the method comprising:
    extracting an SEM image and a GDS image to perform pattern matching;
    performing a two-dimensional FFT for the extracted GDS image and analyzing a low spatial frequency;
    determining whether pattern is a repeated pattern or non-repeated pattern by using the analyzed low spatial frequency; and
    limiting an X/Y range for pattern matching when the pattern is a repeated pattern and then performing pattern matching between the SEM image and the GDS image.

4. The method of claim 3, wherein when the pattern is a non-repeated pattern, the method further comprises performing pattern matching between the GDS image and the SEM image through an existing method.

5. The method of claim 3, wherein performing the pattern matching comprises:
    calculating a pattern matching range and a movement mean value obtained by deducting a pattern matching position value from a movement position in the event of pattern matching; and
    performing a pattern matching of the SEM image with the GDS image by limiting an X, Y range of the calculated pattern matching.

6. The method of claim 3 further comprising re-performing a pattern matching of the SEM image with the GDS image after increasing, by about 20%, the X, Y range for the pattern matching when in the performing of the pattern matching, the pattern matching was not successful.

* * * * *